(12) United States Patent
Soininen et al.

(10) Patent No.: US 6,679,951 B2
(45) Date of Patent: Jan. 20, 2004

(54) METAL ANNEAL WITH OXIDATION PREVENTION

(75) Inventors: Pekka J. Soininen, Espoo (FI); Kai-Erik Elers, Portland, OR (US); Ernst H. A. Granneman, Hilversum (NL)

(73) Assignee: ASM Intenational N.V., Bilthoven (NL)

( * ) Notice: Subject to any disclaimer, the term of this patent is extended or adjusted under 35 U.S.C. 154(b) by 0 days.

(21) Appl. No.: 09/991,332

(22) Filed: Nov. 13, 2001

(65) Prior Publication Data

US 2002/0092584 A1 Jul. 18, 2002

Related U.S. Application Data

(63) Continuation of application No. PCT/FI01/00473, filed on May 15, 2001.

(30) Foreign Application Priority Data

May 15, 2000 (FI) .............................................. 20001163

(51) Int. Cl.[7] .............................................. C23C 22/00
(52) U.S. Cl. ..................... 148/240; 148/274; 148/276; 148/280; 148/282; 148/687; 427/255.14; 427/255.21
(58) Field of Search ................................ 148/240, 274, 148/276, 280, 282, 687; 427/255.14, 255.21

(56) References Cited

U.S. PATENT DOCUMENTS

| 4,058,430 A | 11/1977 | Suntola et al. ............... 156/611 |
| 4,860,687 A | 8/1989 | Frijlink ....................... 118/500 |
| 5,382,333 A * | 1/1995 | Ando et al. .................... 156/81 |
| 5,711,811 A | 1/1998 | Suntola et al. ............... 118/711 |
| 5,731,634 A | 3/1998 | Matsuo et al. ............... 257/752 |
| 5,865,365 A | 2/1999 | Nishikawa et al. | |
| 5,939,334 A | 8/1999 | Nguyen et al. ............. 438/689 |
| 6,006,763 A | 12/1999 | Mori et al. | |
| 6,033,584 A | 3/2000 | Ngo et al. ...................... 216/67 |
| 6,066,892 A | 5/2000 | Ding et al. .................. 257/751 |
| 6,108,937 A | 8/2000 | Raaijmakers ................. 34/433 |
| 6,124,189 A | 9/2000 | Watanabe et al. ........... 438/586 |
| 6,130,123 A | 10/2000 | Liang et al. ................. 438/217 |
| 6,136,163 A | 10/2000 | Cheung et al. ............. 204/198 |

FOREIGN PATENT DOCUMENTS

| DE | 41 08 73 | 3/1925 |
| EP | 0 469 470 A1 | 2/1992 |
| EP | 0 880 168 A2 | 11/1998 |
| GB | 2 340 508 A | 2/2000 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 01/50502 A1 | 7/2001 |

OTHER PUBLICATIONS

Yagishita, T., et al., "Cleaning of Copper Surface Using Vapor–Phase Organic Acids," Materials Research Society Spring 2003 Meeting, Symposium E, Session E3, Paper E3.28, no month data.

(List continued on next page.)

Primary Examiner—Andrew L. Oltmans
(74) Attorney, Agent, or Firm—Knobbe, Martens, Olson & Bear, LLP

(57) ABSTRACT

The invention relates generally to the prevention of copper oxidation during copper anneal processes. In one aspect of the invention, copper oxidation is prevented by carrying out the anneal in the presence of one or more organic reducing agents.

36 Claims, 2 Drawing Sheets

OTHER PUBLICATIONS

SOI Technology: IBM's Next Advance In Chip Design, date unknown.

Baglia, J., Associate Editor, "New Designs and Materials Tackle 1 Gb Memory Challenge," *Semiconductor International,* World Wide Web address: semiconductor.net, Nov. 2000.

Basceri, C., Ph.D. thesis, "Electrical and Dielectric Properties of (Ba,Sr) $TiO_3$ Thin Film Capacitors for Ultra–High Density Dynamic Random Access Memories," pp. 13–31, Raleigh, N.C. State University (1997), no month.

Bursky, D., "Hit Up IEDM For Gigabit And Denser DRAMs And Merged Logic/Memory," *Electronic Design,* World Wide Web address: planetee.com, (Dec. 1, 1998).

Campbell, S.A. et al., "Titanium dioxide ($TiO_2$)–based gate insulators," *IBM J. Res. Develop.,* vol. 43, No. 3, pp. 383–392 (May 1999).

Fukuzumi, Y. et al., "Liner–Supported Cylinder (LSC) Technology to realize Ru/$Ta_2O_5$/Ru Capacitor for Future DRAMs," *IEEE,* IED 2000, Session 34 (2000), no month data.

Hones, P. et al., "MOCVD of ThinRuthenium Oxide Films: Properties and Growth Kinetics," *Chem. Vap. Deposition,* vol. 6, No. 4, pp. 193–198 (2000), no month data.

Inoue, N. et al., "Low thermal–budget fabrication of sputtered–PZT capacitor on multilevel interconnects for embedded FeRAM," *IEEE,* IED 2000, Session 34 (2000), no month data.

Integrated Circuit Engineering Corporation, Practical Integrated Circuit Fabrication Seminar (1998), no month data.

Jung, D. et al., "A Novel Ir/$IrO_2$/Pt–PZT–Pt/$IrO_2$/Ir Capacitor for A Highly Reliable Mega–Scale FRAM," *IEEE,* IED 2000, Session 34, (2000), no month data.

Kawamoto, Y. et al., "The Outlook for Semiconductor Processes and Manufacturing Technologies in the 0.1–$\mu$m Age," *Hitachi Review,* vol. 48, No. 6, pp. 334–339 (1999), no month data.

NEC Device Technology International, No. 48, pp. 4–8, (1998), no month data.

Onda N. et al., "Hydrogen Plasma Cleaning a Novel Process for IC–Packaging," p. 311, Worldwide Web Address: Semiconductor Fabtech.com (1998), no month data.

Solanki R. et al., "Atomic Layer Deposition of Copper Seed Layers," *Electrochemical and Solid–State Letters,* vol. 3, No. 10, pp. 479–480 (2000), no month data.

Sundani et al., Oral presentation of dual damascene process, slides (date unknown).

Ultiainen, M. et al., "Studies of NiO thin film formation by atomic layer epitaxy," *Materials Science & Engineering,* vol. B54, pp. 98–103 (1998), no month data.

Utriainen, M. et al., "Studies of metallic thin film growth in an atomic layer epitaxy reactor using M(acac)$_2$ (M = Ni, Cu, Pt) precursors," *Applied Surface Science,* vol. 157, pp. 151–158 (2000), no month data.

Winbond News Release, World Wide Web address: winbond.com, (Dec. 13, 2000).

Won, Seok–Jun et al., "Conformal CVD–Ruthenium Process for MIM Capacitor in Giga–bit DRAMs," *IEEE,* IED 2000, Session 34 (2000), no month data.

Xu, P. et al., "A Breakthrough in Low–k Barrier/Etch Stop Films for Copper Damascene Applications," *Semiconductor Fabtech,* 11th Edition, p. 239 (2000), no month data.

Yoon, Dong–Soo et al., "Tantalum–ruthenium dioxide as a diffusion barrier between Pt bottom electrode and $TiSi_2$ ohmic contact layer for high density capacitors," *Journal of Applied Physics,* vol. 86, No. 5, pp. 2544–2549 (1999), no month data.

Yoon, Dong–Soo et al., "Investigation of $RuO_2$–Incorporated Pt Layer as a Bottom Electrode and Diffusion Barrier for High Epsilon Capacitor Applications," *Electrochemical and Solid–State Letters,* vol. 3, No. 8, pp. 373–376 (2000), no month data.

Yoon, Y.–G. et al., 197th Meeting Program Information II, The Electrochemical Society, 197th Meeting—Toronto, Ontario, Canada, May 14–18, 2000, Program Information, I1—Rapid Thermal and Other Short–Time Processing Technologies I, Electronics Division/Dielectric Science and Technology Division/High Temperature Materials Division, 2000, Wednesday, May 17, 2000, New Applications of RTP, Co–Chairs: A. Fiory and D.–L Kwong, Time 11:10 Abs#550, Title: Development of RTA Process for the Crystallization of a–Si Thin Film—Y.–G. Yoon, T.–K. Kim, K.–B. Kim, J.–Y. Chio, B.–I Lee, and S.–K. Joo (Seoul National Univ.).

* cited by examiner

METAL ANNEAL WITH OXIDATION PREVENTION

REFERENCE TO RELATED APPLICATIONS

The present application is a cont. and claims priority under 35 U.S.C. §120 to PCT Application No. FI01/00473, filed May 15, 2001, designating the U.S., which in turn claims priority under 35 U.S.C. §119 to Finnish Patent Application No. 20001163, filed May 15, 2000, abandoned.

FIELD OF THE INVENTION

The invention relates generally to preventing copper oxidation during a copper anneal by conducting the anneal in a reducing environment.

BACKGROUND OF THE INVENTION

When fabricating integrated circuits, layers of insulating, conducting and semiconducting materials are deposited and patterned to produce desired structures. Metallization processes include contact formation and metal line or wire formation. Contact formation vertically connects conductive layers through one or more insulating layers. Conventionally, contact vias or openings are formed in an insulating layer. The vias are then filled with conductive material, thereby interconnecting electrical devices and wiring above and below the insulating layers. The layers interconnected by vertical contacts typically include horizontal metal lines running across the integrated circuit.

The interconnects in integrated circuits have traditionally been made of aluminum. Recently, as circuit density has increased, copper has become an attractive material in the field due to its lower resistivity and higher resistance to electromigration. In a typical damascene metallization scheme, trenches and vias are filled with copper by seed layer formation followed by an electroplating process, such as electrochemical deposition (ECD).

Following deposition, the copper layer is preferably annealed. The copper anneal is typically carried out at low temperatures, e.g. below 400° C. In the annealing process the copper recrystalizes to form a film with low resistance as compared to the film as deposited. The annealed copper also has an increased grain size and a grain structure that improves the physical properties of the copper layer.

Oxidation of the copper layer during the anneal can be detrimental to subsequent processes. As copper oxidizes rapidly at temperatures above 65° C., steps are taken to prevent oxidation of the copper layer during the anneal. For example, the reaction chamber in which the anneal is to take place may be sealed by means of a gate valve and purged with a large flow of inert gas to remove all oxygen and water vapor. Such a reaction chamber is described, for example, in U.S. Pat. No. 6,136,163. Accordingly, the process typically employs a high quality vacuum chamber and large quantities of purge gas to keep the oxygen and water vapor levels sufficiently low. Typically the anneal process is operated at atmospheric pressure, although sub-atmospheric pressure anneals are also possible. $H_2$ may be added to the reaction chamber in an attempt to further inhibit oxidation of the copper layer during annealing. However, at the typical annealing temperatures $H_2$ is not very effective at inhibiting oxidation. This is due at least in part to the low reaction rate of the $H_2$. Further, after completion of the anneal, the wafer needs to be cooled down to a sufficiently low temperature in order to prevent oxidation during removal of the wafer from the reaction chamber.

Accordingly, a need exists for more effective methods of preventing oxidation of deposited copper layers during copper anneal processes.

SUMMARY OF THE INVENTION

In accordance with one aspect of the present invention, a process is provided for annealing a metal layer on a substrate. The process comprises heating the substrate to a temperature suitable for annealing the metal while contacting the substrate with one or more organic reducing agents. The metal layer is preferably a copper layer.

According to another aspect, the present invention provides a process for producing an integrated circuit, comprising depositing a copper layer on a substrate and annealing the copper layer in the presence of one or more organic reducing agents.

According to yet another aspect, the present invention provides a process for annealing a copper layer during the production of an integrated circuit. A substrate comprising a copper layer is loaded into a reaction chamber and contacted with one or more organic reducing agents while it is heated to a temperature between about 150° C. and about 450° C.

The organic reducing agents preferably comprise at least one functional group selected from the group consisting of alcohol (—OH), aldehyde (—CHO), and carboxylic acid (—COOH) and are preferably provided in the vapor phase.

DETAILED DESCRIPTION OF THE PREFERRED EMBODIMENT

Figure 1:
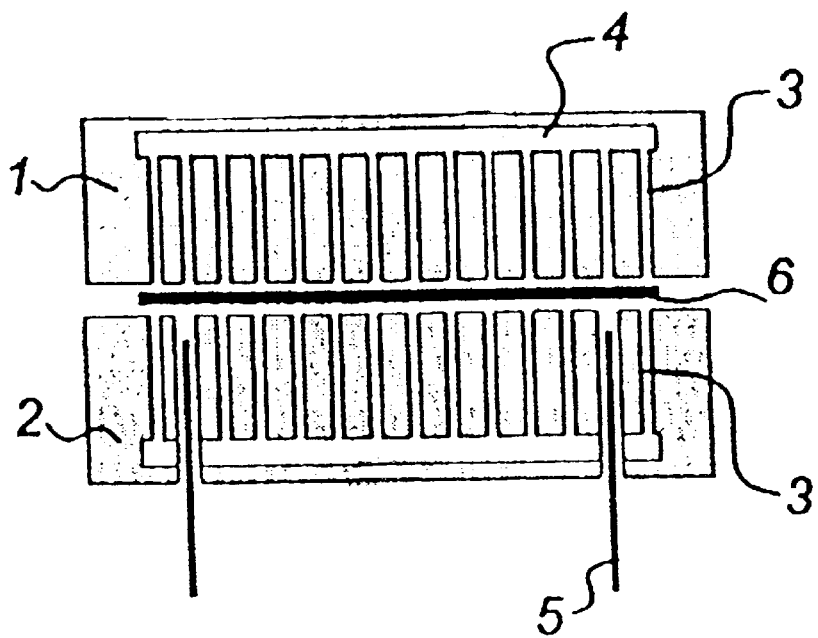
FIG. 1 is a schematic diagram of a floating wafer reactor in which a copper layer on a substrate may be annealed in accordance with a preferred embodiment of the invention.

Though described in the context of certain preferred materials and equipment, it will be understood, in view of the present disclosure, that the methods described herein will have application to a variety of other materials, equipment and processes.

Definitions

As used herein, the terms "oxidizing" and "oxidation" refer to the incorporation of oxygen atoms into a metal layer, particularly a copper layer. Oxidation is "prevented" when there is no substantial increase in the number of oxygen atoms present in the metal layer.

The terms "reduction" and "reducing" refer to the removal of oxygen atoms from a metal layer, particularly a copper layer.

The term "copper layer" refers to a layer of that is primarily comprised of copper. However, it is contemplated that a "copper layer" may have other atoms, such as oxygen, incorporated therein.

Copper Anneal

In a typical metallization scheme a barrier layer is deposited over feature surfaces on a substrate. A seed layer, usually of copper, is then deposited over the barrier layer and the features are filled with copper by an electroplating process, such as electrochemical deposition.

Following deposition of copper into substrate features the copper layer is annealed. Annealing serves to decrease the resistance of the copper layer and improve its physical characteristics. Annealing of the copper layer is typically accomplished by placing the substrate in a reaction space within a copper anneal module and heating to a temperature between about 150° C. and about 450° C. The temperature is usually less than about 500° C. As copper oxidizes rapidly at temperatures above about 65° C., it is necessary to take active measures to prevent copper oxidation during the annealing process. In one aspect of the present invention, copper oxidation is prevented by contacting the substrate with one or more reducing agents during at least part of the time the substrate is heated sufficiently to cause oxidation of the copper layer.

In the preferred embodiment copper oxide formation is prevented by carrying out the copper anneal while contacting the substrate with one or more organic reducing agents that are capable of preventing copper oxidation. More preferably the copper anneal is carried out in the presence of an organic reducing agent in vapor form. The substrate is preferably also contacted with the organic reducing agent during loading and unloading of the substrate from the reaction chamber because at this time it is typically both heated and exposed to oxidizing agents. Depending on the equipment used, the reaction chamber may be purged of oxidizing agents and moisture during the actual annealing process. Thus, in an another embodiment the substrate is contacted with the organic reducing agent only during loading and unloading from the reaction chamber.

In one embodiment a substrate containing a copper layer to be annealed is placed in a reaction chamber, and the reaction chamber is evacuated to vacuum. An organic reducing agent is vaporized and fed to the reaction chamber, optionally with the aid of an inert carrier gas, such as nitrogen or hydrogen. A vapor mixture may also be used, comprising two or more organic reducing agents.

The organic reducing agent vapor is contacted with the substrate and the temperature of the substrate is increased to the desired anneal temperature. Because the reducing agents of the preferred embodiments are so effective, any copper oxide that forms on the substrate as a result of the increased temperature is reduced to copper metal by the organic reducing agent. Accordingly, strict exclusion of moisture or oxygen before heating is not necessary and the anneal tool can optionally be maintained at a high temperature during wafer loading and unloading.

In a further embodiment any copper oxide that was formed prior to the anneal, such as during transport of the substrate from the copper deposition tool to the copper anneal module, or during loading of the substrate into the anneal module, is also reduced to copper by the organic reducing agent.

Typically the reaction space is then purged with an inert carrier gas to remove the unreacted organic reducing agent and the reaction products and/or by-products.

Annealing of the copper layer in the presence of one or more organic reducing agents may be carried out in a wide temperature range. The temperature in the reaction space during copper anneal is preferably between about 150° C. and about 450° C., more preferably between about 250° C. and about 350° C. The partial pressure of the reducing agent in the reaction space is preferably between about 0.01 mbar and about 20 mbar, more preferably between about 1 mbar and about 10 mbar. The processing time will vary according to the temperature. Preferable anneal times are between about 5 and 120 seconds, more preferably between about 30 and 60 seconds.

Although the preferred embodiments are directed to preventing copper oxidation during the annealing of a copper layer, the skilled artisan will be able to adjust the parameters described above to prevent oxidation of tungsten, silver or nickel or of any other metal layer during annealing.

Processing

In the preferred embodiment the copper anneal is carried out in an anneal station or module and the substrate is maintained below 65° C. during loading and unloading. As a result, a traditional furnace is not ideal because of the amount of time it takes to heat up and cool down. Rather, the anneal is preferably carried out in a reactor where the substrate temperature can be increased and decreased rapidly, such as the reactors described in U.S. Pat. No. 6,136,163, WO 99/17343, WO 01/50502 and U.S. Pat. No. 6,108,937.

In the preferred embodiment the anneal is carried out in a Levitor™ floating wafer reactor (ASM International), as described in WO 01/50502, which is hereby incorporated by reference. Advantageously, in the floating wafer reactor the substrate temperature can be increased and decreased rapidly with minimal or no temperature cycling of the tool itself. In addition there is no direct contact between the heated part of the reactor and the wafer, providing more even heating.

Briefly, the substrate comprising a copper layer is placed in a reaction space between two substantially flat parts that are positioned opposite each other and parallel to the substrate, as shown schematically in FIG. 1. The two parts 1 and 2 preferably have a heat capacity several times greater than the heat capacity of the substrate 6, such that the temperature of the parts does not change appreciably as the substrate temperature changes and as substrates are loaded and unloaded. The first part 1 is provided with heating means to bring the first part 1 to a high temperature, preferably somewhat higher than the temperature at which the copper is to be annealed. For example, the first part 1 may be heated to a temperature of 285° C. for an annealing temperature of 250° C. The second part 2 is provided with a cooling means to keep the second part at a low temperature, preferably less than 65° C. A number of channels 3 extend into each part and are connected to at least two separate gas sources.

A substrate 6 is moved into the space between the upper part 1 and lower part 2 where it is supported by pins 5. The upper part 1 and lower part 2 are then brought closer to each other and the heat treatment is carried out as described below.

The temperature of the substrate 6 can be manipulated after loading in a number of different ways, several of which are exemplified here. First, by increasing the relative pressure of the gas flowing through the channels 3 in the lower part 2, the substrate can be moved closer to the heated upper part 1. The close proximity of the substrate 6 to the hotter upper part 1 increases the substrate temperature close to the temperature of the upper part 1, preferably to the annealing temperature. The distance between the substrate 6 and the upper part 1 is preferably less than 1 mm, more preferably less than 0.15 mm, to ensure a strong thermal coupling between the reactor part 1 and the substrate 6. Once the substrate 6 has been heated for a sufficient time to allow the copper to anneal, the relative pressure can be reversed such that the substrate 6 is moved closer to the cooled lower part 2. As a result, the substrate temperature is reduced to close to the temperature of the cooled lower part 2, preferably less than about 65° C.

In another embodiment the heat conductance of specific gases is used to heat and cool the substrate 6. By flowing a relatively highly conductive gas, such as helium, through the channels 3 of the heated upper part 1 and a poorly conductive gas, such as nitrogen, through the channels 3 of the cooled lower part 2, the temperature of the substrate can be increased to approximately the temperature of the upper part 1, preferably to the annealing temperature. After annealing, the gas distribution can be reversed such that a poorly conductive gas flows through the channels 3 of the heated upper part 1 and a highly conductive gas flows through the channels 3 of the cooled lower part 2. As a result, the substrate temperature is reduced to the handling temperature, preferably less than 65° C.

In order to prevent oxidation of the copper layer during the anneal process, the gas that flows through the upper part 1 and/or lower part 2 preferably comprises one or more reducing agents, more preferably one or more organic reducing agents. One of ordinary skill in the art can determine the amount of reducing agent in the gas that is necessary to prevent oxidation of the copper layer during the annealing process. In one embodiment the flow of organic reducing agent is shut off after sufficient time to purge the chamber of oxidants and moisture.

In another embodiment the anneal is carried out in a reaction space that is maintained at the annealing temperature. Thus the substrate temperature is not maintained below 65° C. during loading into the reactor, but rather increases during the loading process. A reducing agent, preferably an organic reducing agent, is present in the reaction chamber and contacts the substrate during loading, processing and unloading, thus preventing oxidation of the copper layer.

In a further embodiment, the substrate is contacted with a reducing agent, preferably an organic reducing agent, during loading and unloading but not during the anneal itself.

Figure 2:
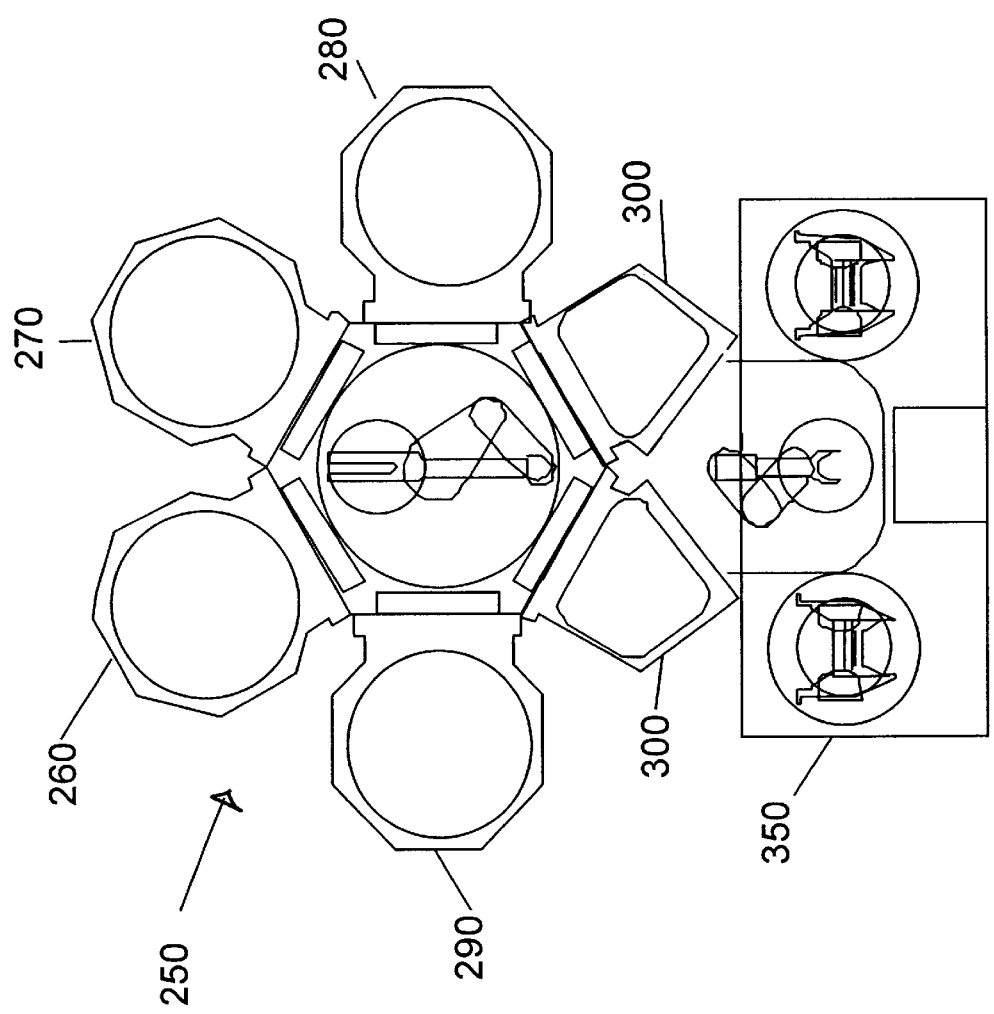
FIG. 2 is a schematic diagram of a cluster tool comprising a copper anneal module clustered with additional modules for other processes, in accordance with an embodiment of the invention.

The copper anneal may be carried out in a module clustered with another reactor, such as on a Rapidfire™ cluster tool (ASM Japan). Preferably the anneal module is close to the copper deposition tool to reduce or prevent oxidation during transport. FIG. 2 is a schematic illustration of a cluster tool 250 that may be used in accordance with this embodiment. A copper deposition module 260 may be clustered to a module 270 in which annealing of the deposited copper layer will occur. Other process steps may be carried out in additional modules 280. In one embodiment the anneal module is clustered to a dielectric deposition tool 290. Carriers with wafers are disposed on the front end loading station 350 and transferred to the process module via load lock chambers 300.

The copper anneal module may be dedicated to copper annealing or may also be used for other processes.
Preferred Reducing Agents According to the preferred embodiment of the present invention, oxidation of a deposited copper layer during annealing is prevented by contacting the substrate, particularly the copper layer, with one or more organic reducing agents during the annealing process. The organic reducing agents preferably have at least one functional group selected from the group consisting of alcohol (—OH), aldehyde (—CHO), and carboxylic acid (—COOH).

The need for sufficient vapor pressure, sufficient thermal stability at the process temperature and the need for sufficient reactivity are preferably considered in selecting the reducing agent(s) to be used. Sufficient vapor pressure means that there should be enough source chemical molecules in the gas phase near the substrate to prevent oxidation. Sufficient thermal stability means, in practice, that the reducing agent itself should not form growth-disturbing condensable phases on the substrate or leave harmful levels of impurities on the substrate through thermal decomposition. Further selection criteria include the availability of the chemical at high purity and the ease of handling.

The reducing agents are also preferably selected such that the reaction by-products are volatile and can be easily removed from the reaction space. In the reduction of copper oxide, the reducing agent is oxidized. Thus, alcohols are oxidized into aldehydes and ketones, aldehydes are oxidized into carboxylic acids and carboxylic acids are oxidized into carbon dioxide. Depending on the specific reactants, water may be formed as a gaseous by-product.

Reducing agents containing at least one alcohol group are preferably selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

wherein $R^1$ is a linear or branched $C_1$–$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

wherein each $R^1$ is selected independently from the group of linear or branched $C_1$–$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

wherein each $R^1$ is selected independently from the group of linear or branched $C_1$–$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5–6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}\text{—}R^2\text{—}OH \quad (IV)$$

wherein X is selected from the group consisting of F, Cl, Br and I, n is an integer from 0 to 2 and $R^2$ is selected from the group of linear or branched $C_1$-$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other preferred derivatives of alcohols include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in one embodiment preferred reducing agents are aldehydes having the general formula (V):

$$R^3\text{—}CHO \quad (V)$$

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred reducing agents are aldehydes having the general formula (VI):

$$OHC\text{—}R^4\text{—}CHO \quad (VI)$$

wherein $R^4$ is a linear or branched $C_1$-$C_{20}$ saturated or unsaturated hydrocarbon. Alternatively, the aldehyde groups may be directly bonded to each other ($R^4$ is null).

Preferred reducing agents containing at least one —COOH group are preferably selected from the group consisting of compounds of the general formula (VII), polycarboxylic acids, halogenated carboxylic acids and other derivatives of carboxylic acids.

Thus, in one embodiment preferred reducing agents are carboxylic acids having the general formula (VII):

$$R^5\text{—}COOH \quad (VII)$$

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A process for annealing a metal layer on a semiconductor substrate in a reaction chamber comprising:
   heating the substrate to a temperature suitable for annealing the metal; and
   contacting the substrate with one or more organic reducing agents during at least part of the time the substrate is sufficiently heated to cause oxidation of the metal layer.

2. The process of claim 1, wherein the substrate is contacted with one or more organic reducing agents during loading and unloading of the substrate from the reaction chamber.

3. The process of claim 1, wherein the substrate is contacted with one or more organic reducing agents during loading and unloading.

4. The process of claim 1, wherein the organic reducing agent comprises at least one functional group selected from the group consisting of alcohol (—OH), aldehyde (—CHO), and carboxylic acid (—COOH).

5. The process of claim 4, wherein the organic reducing agent is selected from the group consisting of primary alcohols, secondary alcohols, tertiary alcohols, polyhyrdroxyalcohols, cyclic alcohols, and halogenated alcohols.

6. The process of claim 4 wherein said organic reducing agent is selected from the group consisting of:
   compounds having the general formula $R^3$—CHO, wherein $R^3$ is hydrogen or a linear or branched $C_1$—$C_{20}$ alkyl or alkenyl group;
   compounds having the general formula OHC—$R^4$—CHO, wherein $R^4$ is a linear or branched $C_1$—$C_{20}$ saturated or unsaturated hydrocarbon;
   a compound of the formula OHC—CHO;
   halogenated aldehydes; and
   other derivatives of aldehydes.

7. The process of claim 4 wherein the organic reducing agent is selected from the group consisting of:
   compounds of the general formula $R^5COOH$, wherein $R^5$ is hydrogen or a linear or branched $C_1$-$C_{20}$ alkyl or alkenyl group;
   polycarboxylic acids;
   halogenated carboxylic acids; and
   other derivatives of carboxylic acids.

8. The process of claim 1, wherein the organic reducing agent is in the vapor phase.

9. The process of claim 1, wherein the temperature suitable for annealing the metal is less than about 500° C.

10. The process of claim 1, wherein the substrate is heated in a reactor comprising an upper part and a lower part.

11. The process of claim 10, wherein the substrate is held in a floating state between the upper part and lower part during annealing.

12. The process of claim 10, wherein the temperature of the upper part and lower part are constant.

13. A process for annealing a metal layer on a semiconductor substrate in a reaction chamber, comprising:
   heating the substrate to a temperature suitable for annealing the metal; and
   contacting the substrate with one or more organic reducing agents during at least part of the time the substrate is sufficiently heated to cause oxidation of the metal layer,
   wherein the substrate is heated in a reactor comprising an upper part and a lower part, wherein the temperature of the upper part and lower part are constant and wherein the temperature of the upper part is about 250° C.

14. The process of claim 1, wherein the substrate is heated by loading into a reaction space at the temperature suitable for annealing.

15. The process of claim 1, wherein said metal layer is a copper layer.

16. A process for producing an integrated circuit comprising depositing a layer of copper on a semiconductor substrate and annealing the copper layer in the presence of one or more organic reducing agents, whereby oxidation of the copper layer is prevented during the anneal.

17. The process of claim 16, wherein the organic reducing agent comprises at least one functional group selected from the group consisting of alcohol (—OH), aldehyde (—CHO), and carboxylic acid (—COOH).

18. The process of claim 17, wherein the organic reducing agent is selected from the group consisting of primary alcohols, secondary alcohols, tertiary alcohols, polyhyrdroxyalcohols, cyclic alcohols, and halogenated alcohols.

19. The process of claim 17, wherein said organic reducing agent is selected from the group consisting of:
compounds having the general formula $R^3$—CHO, wherein $R^3$ is hydrogen or a linear or branched $C_1$–$C_{20}$ alkyl or alkenyl group;
compounds having the general formula OHC—$R^4$—CHO, wherein $R^4$ is a linear or branched $C_1$–$C_{20}$ saturated or unsaturated hydrocarbon;
a compound of the formula OHC—CHO;
halogenated aldehydes; and
other derivatives of aldehydes.

20. The process of claim 17, wherein the organic reducing agent is selected from the group consisting of:
compounds of the general formula $R^5$COOH, wherein $R^5$ is hydrogen or a linear or branched $C_1$–$C_{20}$ alkyl or alkenyl group;
polycarboxylic acids;
halogenated carboxylic acids; and
other derivatives of carboxylic acids.

21. The process of claim 16, wherein the copper is annealed at a temperature between about 150° C. and about 450° C.

22. A process for producing an integrated circuit comprising depositing a layer of copper on a substrate and annealing the copper layer in the presence of one or more organic reducing agents, whereby oxidation of the copper layer is prevented during the anneal, wherein the copper is annealed at a temperature between about 250° C. and about 350° C.

23. A process for annealing a copper layer during the production of an integrated circuit comprising:
loading a semiconductor substrate comprising a copper layer into a reaction chamber; and
contacting the copper layer with one or more organic reducing agents while heating the substrate to an annealing temperature between about 150° C. and about 450° C.

24. A process for annealing a copper layer during the production of an integrated circuit comprising:
loading a substrate comprising a copper layer into a reaction chamber; and
contacting the copper layer with one or more organic reducing agents while heating the substrate to an annealing temperature between about 250° C. and about 350° C.

25. The process of claim 23 wherein the organic reducing agents are in the vapor phase.

26. A process for annealing a copper layer during the production of an integrated circuit comprising:
loading a substrate comprising a copper layer into a reaction chamber; and
contacting the copper layer with one or more organic reducing agents while heating the substrate to an annealing temperature between about 150° C. and about 450° C,
wherein the substrate is maintained at a temperature of less than about 65° C. during loading and unloading.

27. The process of claim 23, wherein the substrate is loaded while the reaction chamber is at the annealing temperature.

28. The process of claim 23, wherein the substrate is maintained at the annealing temperature for between about 5 and 120 seconds.

29. The process of claim 28, wherein the substrate is maintained at the annealing temperature for between about 30 and 60 seconds.

30. The process of claim 23, wherein the partial pressure of the organic reducing agent in the reaction chamber is between about 0.01 and 20 mbar during the annealing process.

31. The process of claim 30, wherein the partial pressure of the organic reducing agent in the reaction chamber is between about 1 and 10 mbar during the annealing process.

32. The process of claim 23, wherein the reaction chamber is clustered with a copper deposition tool.

33. A process for annealing a metal layer on a semiconductor substrate comprising annealing the metal layer on the substrate in a reaction chamber and contacting the substrate with one or more flowing organic reducing agents while the substrate is present in the reaction chamber in which the metal layer is annealed.

34. The process of claim 33, wherein the substrate is contacted with one or more organic reducing agents during loading and unloading of the substrate from the reaction chamber which the metal layer is annealed.

35. The process of claim 33, wherein the substrate is contacted with one or more organic reducing agents between the loading and unloading of the substrate from the reaction chamber in which the metal is annealed.

36. The process of claim 33, wherein the flow of organic reducing agent is shut off after a sufficient amount of time to purge the reaction chamber.

* * * * *